US011557345B2

(12) United States Patent
Reina

(10) Patent No.: US 11,557,345 B2
(45) Date of Patent: Jan. 17, 2023

(54) DYNAMIC MEMORY PROGRAMMING VOLTAGE STEP FOR STRENUOUS DEVICE CONDITIONS

(71) Applicant: Micron Technology, Inc., Boise, ID (US)

(72) Inventor: Vincenzo Reina, Munich (DE)

(73) Assignee: Micron Technology, Inc., Boise, ID (US)

( * ) Notice: Subject to any disclaimer, the term of this patent is extended or adjusted under 35 U.S.C. 154(b) by 1063 days.

(21) Appl. No.: 16/228,255

(22) Filed: Dec. 20, 2018

(65) Prior Publication Data

US 2020/0202938 A1 Jun. 25, 2020

(51) Int. Cl.
*G11C 16/10* (2006.01)
*G11C 16/34* (2006.01)
*G06F 11/07* (2006.01)
*G11C 11/56* (2006.01)
*G11C 16/04* (2006.01)

(52) U.S. Cl.
CPC ............ *G11C 16/10* (2013.01); *G06F 11/076* (2013.01); *G06F 11/0727* (2013.01); *G11C 16/349* (2013.01); *G11C 11/5628* (2013.01); *G11C 11/5671* (2013.01); *G11C 16/0483* (2013.01)

(58) Field of Classification Search
None
See application file for complete search history.

(56) References Cited

U.S. PATENT DOCUMENTS

| 2005/0146374 A1* | 7/2005 | Sumita | H03K 19/00384 |
| | | | 327/534 |
| 2007/0263455 A1* | 11/2007 | Cornwell | G11C 11/5628 |
| | | | 365/185.23 |
| 2012/0124273 A1* | 5/2012 | Goss | G11C 16/349 |
| | | | 711/E12.001 |
| 2016/0225436 A1* | 8/2016 | Wang | G06F 11/073 |
| 2020/0073451 A1* | 3/2020 | Nowell | G11C 7/04 |

FOREIGN PATENT DOCUMENTS

| CN | 107992149 A | * | 5/2018 | ............ G05F 1/625 |
| GB | 2444553 A | * | 6/2008 | ....... G01R 31/31707 |

* cited by examiner

*Primary Examiner* — Guerrier Merant
(74) *Attorney, Agent, or Firm* — Perkins Coie LLP

(57) ABSTRACT

A memory device can dynamically select a voltage step size for programming (i.e., charging) memory cells. The memory device can increase the voltage step size to reduce programming time or decrease the voltage step size to reduce errors. The memory device can identify device conditions, such as temperature or amount of use (e.g., a count of program/erase cycles). The memory device can increase the voltage step size when the device conditions are less likely to cause errors (e.g., in a middle temperature range or below a threshold number of program/erase cycles) or can decrease the voltage step size when the device conditions are more likely to cause errors (e.g., in a high or low temperature range or above a threshold number of program/erase cycles).

20 Claims, 4 Drawing Sheets

DYNAMIC MEMORY PROGRAMMING VOLTAGE STEP FOR STRENUOUS DEVICE CONDITIONS

TECHNICAL FIELD

The present disclosure generally relates to a memory sub-system, and more specifically, relates to dynamically selecting a memory programming voltage step depending on whether the memory is experiencing strenuous device conditions.

BACKGROUND

A memory sub-system can store and access information using volatile memory devices, non-volatile memory devices (e.g., flash "NAND" and/or "NOR" technology), or combination memory devices. Some memory sub-systems, such as flash memory, utilize electrical energy, along with corresponding threshold levels or processing voltage levels, to store and access data. During a programming operation, memory components can be charged to a target level by iteratively applying voltage to memory components until the memory components store a charge at the target voltage levels. The increment of the amount of voltage applied in each iteration is referred to as the "programming voltage step size" or "voltage step size."

The performance or characteristics of memory devices can change or degrade due to strenuous device conditions, such as a high number of program/erase cycles or external conditions such as extreme temperatures or changes in temperature between programming and reading. For example, in many industrial and automotive applications, memory devices are used in extreme cold (e.g., −40 degrees Celsius) or extreme heat (e.g., 105 degrees Celsius). As another example, programming at −5 degrees Celsius and reading back at 85 degrees Celsius can cause an increase in errors. These strenuous device conditions can lead to errors and other performance issues, such as programming operations skipping from being too far below the target level in one programming step iteration to being too far above the target level in the next programming step iteration. One way to address errors and performance issues raised by these strenuous device conditions is to set a low voltage step size, reducing the possibility of missing target voltage levels when program operations are performed during strenuous device conditions. However, reducing the voltage step size requires more iterations to perform programming operations, slowing them down.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
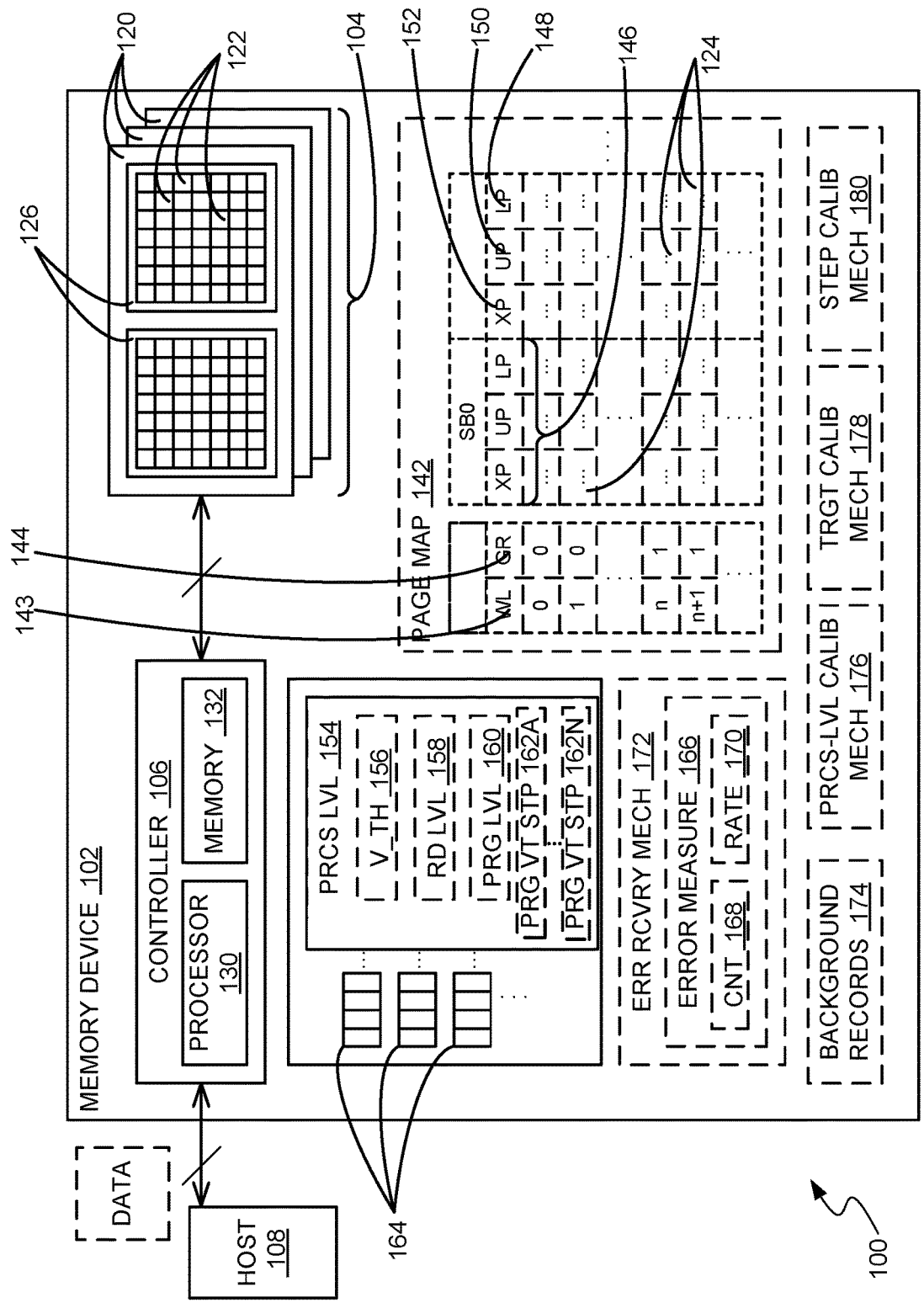
FIG. 1 illustrates an example computing environment that includes a memory sub-system, in accordance with some embodiments of the present disclosure.

Aspects of the present disclosure are directed to dynamically selecting a voltage step size for performing program operations in a memory sub-system or "memory device." In various implementations, a memory sub-system can include non-volatile memory components, such as, for example, negative- and (NAND). The host system can provide data to be stored at the memory sub-system and can request data to be retrieved from the memory sub-system. The technology disclosed herein relates to systems and methods for dynamically calibrating a programming operation for memory devices.

A memory device can dynamically calibrate a voltage step size for programming (i.e., charging) memory cells. The memory device can increase the voltage step size to reduce programming time or decrease the voltage step size to reduce errors. The memory device can identify device conditions, such as temperature (e.g., total value or change between programming and read) or amount of use (e.g., a count of program/erase cycles). The memory device can increase the voltage step size when the device conditions are less likely to cause errors (e.g., in a middle temperature range, when program and read temperatures are within a threshold of each other, and/or when there are below a threshold number of program/erase cycles) or can decrease the voltage step size when the device conditions are more likely to cause errors (e.g., in a high or low temperature range, when program and read temperatures are not within a threshold of each other, or when there are above a threshold number of program/erase cycles).

In typical memory devices, a single voltage step size is defined. In some cases, the voltage step size is set relatively high, allowing for fast memory programming operations. However, this causes excess errors by over-charging memory cells when the memory device is in strenuous device conditions, such as very high or very low temperatures. In other cases, the voltage step size is set relatively low, reducing the amount of memory errors, even in strenuous device conditions. However, this causes relatively slow memory program operations, even in situations where the reduced speed is unnecessary for reliability. Aspects of the present disclosure address the above and other deficiencies by implementing a dynamic selection of voltage step sizes. This allows lower, safer voltage step sizes to be used when a memory device is experiencing strenuous device conditions and allows higher, faster voltage step sizes to be used when the memory device is not experiencing strenuous device conditions.

In the illustrated embodiments below, the memory devices are described in the context of devices incorporating NAND-based non-volatile storage media (e.g., NAND flash). Memory devices configured in accordance with other embodiments of the present technology, however, can include other types of suitable storage media in addition to or in lieu of NAND-based storage media, such as NOR-based storage media, magnetic storage media, phase-change storage media, ferroelectric storage media, etc.

FIG. 1 is a block diagram of a memory system 100 with dynamic voltage step size selection for programming operations configured in accordance with an embodiment of the present technology. The memory system 100 includes a memory device 102. As shown, the memory device 102 includes a memory array 104 (e.g., NAND flash) and a controller 106. The memory device 102 can operably couple the memory array 104 to a host device 108 (e.g., an upstream central processor (CPU)). The memory array 104 can include circuitry configured to store data in the memory array 104 and provide access to data in the memory array 104. The memory array 104 can be provided as semiconductors, integrated circuits and/or external removable devices in computers or other electronic devices. The memory array 104 includes a plurality of memory regions, or memory units 120. The memory units 120 can be individual memory dies, memory planes in a single memory die, a stack of memory dies vertically connected through-silicon vias (TSVs), or the like. In some implementations, each of the memory units 120 can be formed from a semiconductor die and arranged with other memory unit dies in a single device package (not shown). In other implementations, one or more of the memory units 120 can be co-located on a single die and/or distributed across multiple device packages. The memory device 102 and/or the individual memory units 120 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 106.

Each of the memory units 120 includes an array of memory cells 122 that each store data. The memory cells 122 can include, for example, floating gate, charge trap, phase change, ferroelectric, magnetoresitive, and/or other suitable storage elements configured to store data persistently or semi-persistently. The memory cells 122 can be one-transistor memory cells that can be programmed to a target state to represent information. For instance, electric charge can be placed on, or removed from, the charge storage structure (e.g., the charge trap or the floating gate) of the memory cell 122 to program the cell to a particular data state. The stored charge on the charge storage structure of the memory cell 122 can indicate a threshold voltage (Vt) of the cell. For example, a single level cell (SLC) can be programmed to a targeted one of two different data states, which can be represented by the binary units 1 or 0.

Some flash memory cells can be programmed to a targeted one of more than two data states. For example, a flash memory cell that can be programmed to any one of four states (e.g., represented by the binary 00, 01, 10, 11) can be used to store two bits of data, and may be referred to as a multilevel cell (MLC). Still other flash memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data. The memory cells 122 capable of storing higher numbers of data states can provide higher density memories without increasing the number of memory cells, since each cell can represent more than one digit (e.g., more than one bit).

The memory cells 122 can be arranged in rows (e.g., each corresponding to a word line 143) and columns (e.g., each corresponding to a bit line). Each word line 143 can include one or more memory pages 124, depending upon the number of data states that the memory cells 122 of that word line 143 are configured to store. For example, a single word line of the memory cells 122 that are each configured to store one of two data states (e.g., SLC memory cells configured to store one bit each) can include a single memory page 124. Alternatively, a single word line 143 of the memory cells 122 that are each configured to store one of four data states (e.g., MLC memory cells configured to store two bits each) can include two memory pages 124. Moreover, within the word line 143, pages 124 can be interleaved so that the word line 143 of memory cells 122 that are each configured to store one of two data states (e.g., SLC memory cells) can include two pages, in an "even-odd bit line architecture" (e.g., where all the memory cells 122 in odd-numbered columns of a single word line 143 are grouped as a first page, and all the memory cells 122 in even-numbered columns of the same word line 143 are grouped as a second page). When even-odd bit line architecture is utilized in the word line 143 of memory cells 122 that are each configured to store larger numbers of data states (e.g., memory cells configured as MLC, TLC, QLC, etc.), the number of pages per word line 143 can be even higher (e.g., 4, 6, 8, etc.). Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line and drain select transistors can be commonly coupled to a drain select line.

The memory device 102 can process data using different groupings of the memory cells 122. For example, the memory pages 124 of the memory cells 122 can be grouped into memory blocks 126. In operation, the data can be written or erased with regards to the various memory regions of the memory device 102, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 0).

In other implementations, the memory cells 122 can be arranged in different types of groups and/or hierarchies than shown in the illustrated embodiments. Further, while shown in the illustrated embodiments with a certain number of memory cells, rows, columns, blocks, and memory units for purposes of illustration, in other implementations, the number of memory cells, rows, columns, blocks, and memory units can vary, and can be larger or smaller in scale than shown in the illustrated examples. For example, in some implementations, the memory device 100 can include only one memory unit 120. Alternatively, the memory device 100 can include two, three, four, eight, ten, or more (e.g., 16, 32, 64, or more) memory units 120. While the memory units 120 are shown in FIG. 1 as each including two memory blocks 126, in other implementations, each memory unit 120 can include one, three, four, eight, or more (e.g., 16, 32, 64, 100, 128, 256 or more) memory blocks. In some implementations, each memory block 123 can include, e.g., 215 memory pages, and each memory page within a block can include, e.g., 212 memory cells 122 (e.g., a "4 k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory system 100, including managing the memory device 102 and handling communications between the memory device 102 and the host device 108. In some implementations, the embedded memory 132 can include memory registers storing, e.g., memory pointers, fetched data, etc. The embedded memory 132 can also include read-only memory (ROM) for storing micro-code. While the exemplary memory device 102 illustrated in FIG. 1 has been illustrated as including the controller 106, in another implementation of the present technology, a memory device may not include a controller, and may instead rely upon external control (e.g., provided by an external host, or by a processor or controller separate from the memory device).

In the illustrated example, further organization or details of the memory array 104 is represented with a page map 142. The page map 142 can represent groupings, addresses, types, or a combination thereof for the memory pages 124 for each of the memory blocks 126. For example, each of the memory blocks 126 can include the memory pages 124 corresponding to a word-line group 144. Also for example, the memory pages 124 can further correspond to a logical page type 146, such as a lower page (LP) 148, an upper page (UP) 150, or an extra page (EP) 152.

The word-line group 144 can include a grouping of the memory pages 124 corresponding to one or more word lines 143 used to implement processing functions, such as read or write for the data. The word-line group 144 can be a grouping of the memory pages 124 for or connected to the word line 143. The word line 143 can correspond to physical layout or architecture of the memory cells 122.

The page type 146, such as for the upper page 150, the lower page 148, and the extra page 152, can represent a grouping of bits in a specific order for the memory pages 124. The types of pages can correspond to a logical layout, architecture, or value for the memory cells 122. For example, the lower page 148 can represent a first information bit stored in the memory pages 124 or the memory cells 122 therein. The lower page 148 can be for SLC type of cells, MLC type of cells. TLC type of cells, or a combination thereof. For another example, the upper page 150 can correspond to or represent a second information bit stored in the memory pages 124 or the memory cells 122 therein. The upper page 150 can be for the TLC or MLC types of the memory cells 122. For another example, the extra page 152 can represent a third information bit, such as for the most significant bit or the least significant bit, stored in the memory pages 124 or the memory cells 122 therein. The extra page 152 can be for the TLC type of the memory cells 122.

The memory device 102 can use processing levels 154 for storing or accessing data. The processing levels 154 can include thresholds or operating levels for voltage or current. The processing levels 154 can include a threshold voltage 156, a read level voltage 158, a programming level voltage 160, one or more programming voltage steps 162A-N, or any combination thereof. The threshold voltage 156 can be the voltage applied to the control gate at which the circuitry for the memory cells 122 becomes conductive and a current can be measured. The threshold voltage 156 can be affected and controlled by controlling an amount of charge held in a floating gate or charge trap of the memory cells 122. The memory device 102 can store an amount of charge into the memory cells 122 based on the programming level voltage 160 to represent a corresponding data value. The memory device 102 applies the programming level voltage 160 to control gate or word line to charge up the floating gate or the charge trap. The floating gate or the charge trap can be electrically isolated, which can enable the memory cell to store and hold the charge.

The memory device 102 can use the stored charge to represent data. For example, storing charges on the floating gate or the charge trap can be for storing bit value of 0 for SLC type cells. Bit value of 1 can correspond to the floating gate or the charge trap with no stored charge for the SLC. In other types of cells, such as for MLC, TLC, or QLC, the memory device 102 can store specific amounts of charge on the floating gate or the charge trap to represent different bit values. The MLC type of cell can have four different charge states, TLC can have eight different charge states, and QLC can have 16 different charge states. Each of the charge states can correspond to a unique binary value as discussed above.

The memory device 102 can read or determine data values stored in the memory cells 122 using the read level voltage 158 corresponding to the data value. The memory device 102 can apply the read level voltage 158 to the control gate and measure the current or the voltage across the memory cell to read the data stored in the cell. The charges stored in the floating gate or the charge trap can screen off or offset the amount of charge placed on control gate for reading or accessing the stored data. As such, with the read level voltage 158 applied, the measured current or the voltage across the memory cell will correspond to the amount of charges stored in the floating gate or the charge trap.

During operation of the memory device 102, electrical characteristics of the device (i.e. charge retention capabilities) can change due to repeated data writes, erases, reads, or external conditions such as temperature. These conditions can lead to breakdown or wearing of the structure electrically isolating the floating gate or the charge trap (e.g. the oxide layers). In accounting for the changing electrical characteristics of the memory cells 122, the memory device 102 can shift or calibrate the read level voltage 158.

The programming level voltage 160 is associated with the read level voltage 158 and the threshold voltage 156. The programming level voltage 160, the read level voltage 158, the threshold voltage 156 or a combination thereof can correspond to the number of bits stored in the memory cells 122, the specific content value of the data stored in the memory cells 122, or a combination thereof.

For example, memory cells 122 configured to store charge in one of two possible states (e.g., SLC memory cells) may have associated programming levels, read levels and threshold voltages that are different from those used with of memory cells 122 configured to store charge in one of four possible states (e.g., MLC memory cells) or memory cells 122 configured to store charge in one of eight possible states (e.g., TLC memory cells). For each type of memory cell (e.g., SLC, MLC, TLC, QLC, etc.), a specific value of the programming level voltage 160, the read level voltage 158, the threshold voltage 156, or a combination thereof can be associated with each of the possible data values.

The memory device 102 can iteratively store charge in the memory cells 122 for the write or program operation, such as for incremental step pulse programming (ISPP). The programming voltage steps 162A-N can include various increments or voltage values for increasing the stored charge in each charging iteration and the memory device 102 can reach the programming level voltage 160 by incrementally storing or increasing amounts of charge corresponding to a selected one of the programming voltage steps 162A-N. Memory device 102 can select one of the programming voltage steps 162A-N to use based on a mapping of memory device conditions to one of the programming voltage steps 162A-N. For example, a standard programming voltage step 162A can be used when a temperature identified for the memory device 102 is within a specified normal range (e.g. 0-85 degrees Celsius) and a reduced programming voltage step 162B can be used when a temperature identified for the memory device 102 is outside the specified normal range. In some implementations, various ranges can be used corresponding to other programming voltage steps 162A-N having different sizes or for other conditions such as based on a number of program erase cycles that have occurred. Additional details on selecting one of the programming voltage steps 162A-N are provided below in relation to FIG. 3.

Figure 2:
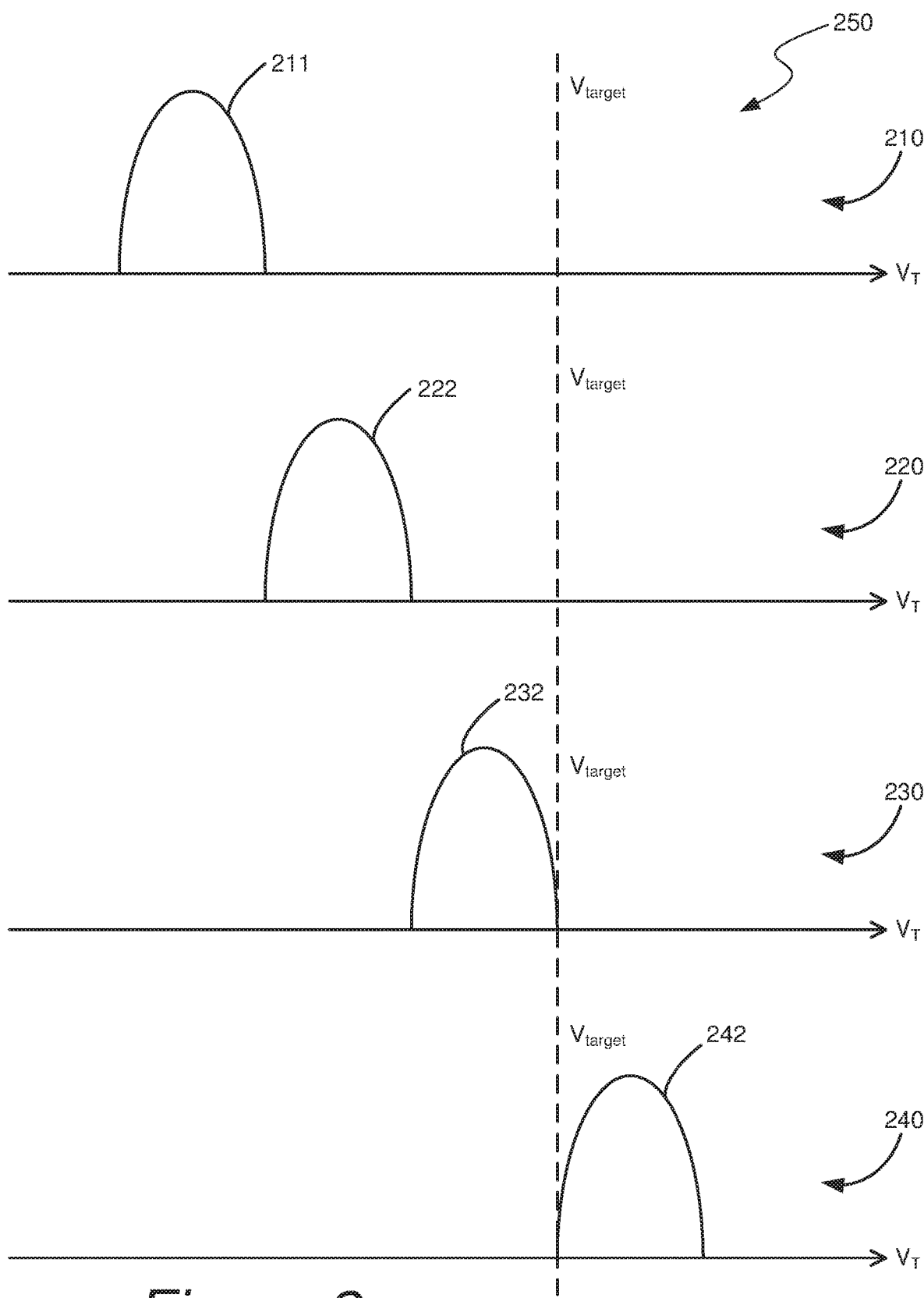
FIG. 2 illustrates the charge stored on a storage structure of a memory cell at a various states of an incremental programming operation, in accordance with some embodiments of the present disclosure.

An example of iteratively applying a selected programming voltage step is illustrated in FIG. 2. FIG. 2 shows the charge stored on the charge storage structure of a memory cell at various states of one such incremental programming operation. The charge 211 stored on the memory cell at time 210 is below a target state 250 when the incremental programming operation begins. To program the memory cell to the target state 250, a series of a selected programming voltage step can be used at each of time 220, 230 and 240 to increase the charge stored on the cell's charge storage structure to charges 222, 232 and 242, respectively. After each programming voltage step is applied, the charge stored on the charge storage structure can be verified to determine whether it has reached the target state 250. At time 240, as the charge 241 has been increased to the target state 250, the programming operation is completed.

For programming more significant bits to a cell that already has been programmed with less significant bits, the number of iterations of applying a selected one of programming voltage steps 162A-N (and verification steps) used in a programming operation may be larger (e.g., due to the addition of a smaller increment of charge with each programming pulse), such that programming more significant bits to a cell can take more time and energy than programming less significant bits.

The processing levels 154 can be stored in the memory device 102, the host device 108, or a combination thereof. For example, the memory device 102 can include one or more level registers 164 on the controller 106, the memory array 104, another memory location of the memory device 102, or a combination thereof for storing the processing levels 154. The level registers 164 can store the threshold voltage 156, the read level voltage 158, the programming level voltage 160, the programming voltage steps 162A-N, or any combination thereof. The memory system 100, controller 106, and/or the host 108 can access the level registers 164, write or adjust the values in the level registers 164, or a combination thereof. Similarly, the processing levels 154 can be stored in the embedded memory of the controller 106, the memory array 104, another memory location of the memory device 102, or a combination thereof.

The memory device 102 can further process errors associated with storage or access of the data. The errors can correspond to a bit or a unit of bits, such as for a code-word, for a page, or for a block, that may be introduced during erase, program or write, or read operations. In addition to the data processing, data retention can further introduce retention error. Other sources of errors can include process variations, defects, electrical coupling or parasitic capacitance-coupling, changes in characteristics or capabilities of the circuitry or components therein, or a combination thereof.

The memory device 102 can track an error measure 166. The error measure 166 can represent a degree, a frequency, an amount or magnitude, a size or number, a processing derivation of the errors, or a combination thereof describing the errors. For example, the error measure 166 can include an error count 168, an error rate 170, or a combination thereof. The error count 168 can represent an amount or magnitude, a degree, a size or number, or a combination thereof describing the errors. For example, the error count 168 can be a bit error count (BEC). The error rate 170 can represent a frequency or a probability of occurrence of the errors, a proportional amount or a percentage of errors, or a combination thereof. For example, the error rate 170 can include a bit error rate (BER). The error measure 166 can correspond to one or more units or groupings within the memory array 104. For example, the error measure 166 can be for one or more of the memory pages 124, the memory cells 122, the word-line group 144, a die, or a combination thereof. For another example, the error measure 166 can correspond to the page type 146, such as for the lower page 148, the upper page 150, or the extra page 152. The error measure 166 can be calculated or tracked by the host device 108, the controller 106, or a combination thereof. The error measure 166 can be stored in the host device 108, the embedded memory of the controller 106, the memory array 104, another memory location of the memory device 102, or a combination thereof. In some implementations, the selection of one of the programming voltage steps 162A-N can be based on one of these error measures reaching a specified threshold level.

The memory system 100 can utilize an error recovery mechanism 172 to detect and/or correct the errors. The memory system 100 can implement the error recovery mechanism 172 using the host device 108, the controller 106, the memory array 104, or a combination thereof. The error recovery mechanism 172 can include a process, function, circuitry, or a combination thereof for detecting the errors in the stored or accessed data, and further for correcting the error and recover the original intended data. In-line corrections and overall data recovery, such as based on or for one or more code-words, can be examples of the error recover mechanism 172. For another example, the error recovery mechanism 172 can utilize an error correcting code (ECC) for the code-words, such as Hamming code, low-density parity-check (LDPC) code or Bose-Chauduri-Hocquenghem (BCH) code, to detect and/or correct the error.

The memory system 100 can further generate and maintain background records 174. The background records 174 can include information describing a history for the memory device 102. For example, the background records 174 can track the errors, the error rate 170, usage or implementation of the error recovery mechanism 172, corresponding description or context data, a processing result or a representation thereof, or a combination thereof. For another example, the background records 174 can track processing results, such as data, levels, results, statistical representation thereof, or a combination thereof associated with dynamic calibration for various different aspects or operations of the memory device 102. The background records 174 can be tracked using the controller 106, the host device 108, or a combination thereof. The background records 174 can be stored in the memory array 104, the embedded memory of the controller 106, another memory location of the memory device 102, the host device 108, or a combination thereof.

The memory system 100 can dynamically calculate or adjust the processing levels 154 based on feedback information. For example, the memory system 100 can continuously update the read level voltage 158 using a processing-level calibration mechanism 176. For another example, the memory system 100 can dynamically select one of the programming voltage steps 162A-N. Further, the memory system 100 can dynamically generate or adjust distribution targets representing histogram showing the number of memory cells having a particular measured value (e.g. a threshold voltage level) corresponding to specific logical values. The measured values can shift due to the breakdown in the oxide layer. The memory system 100 can dynamically adjust the distribution targets based on feedback data using a target calibration mechanism 178 to adjust for the shift in the measured values. The processing-level calibration mechanism 176, the target calibration mechanism 178, and the step calibration mechanism 180 can each be a unique process, method, function, circuitry, configuration, or a combination thereof for implementing the above-mentioned calibrations.

Figure 3:
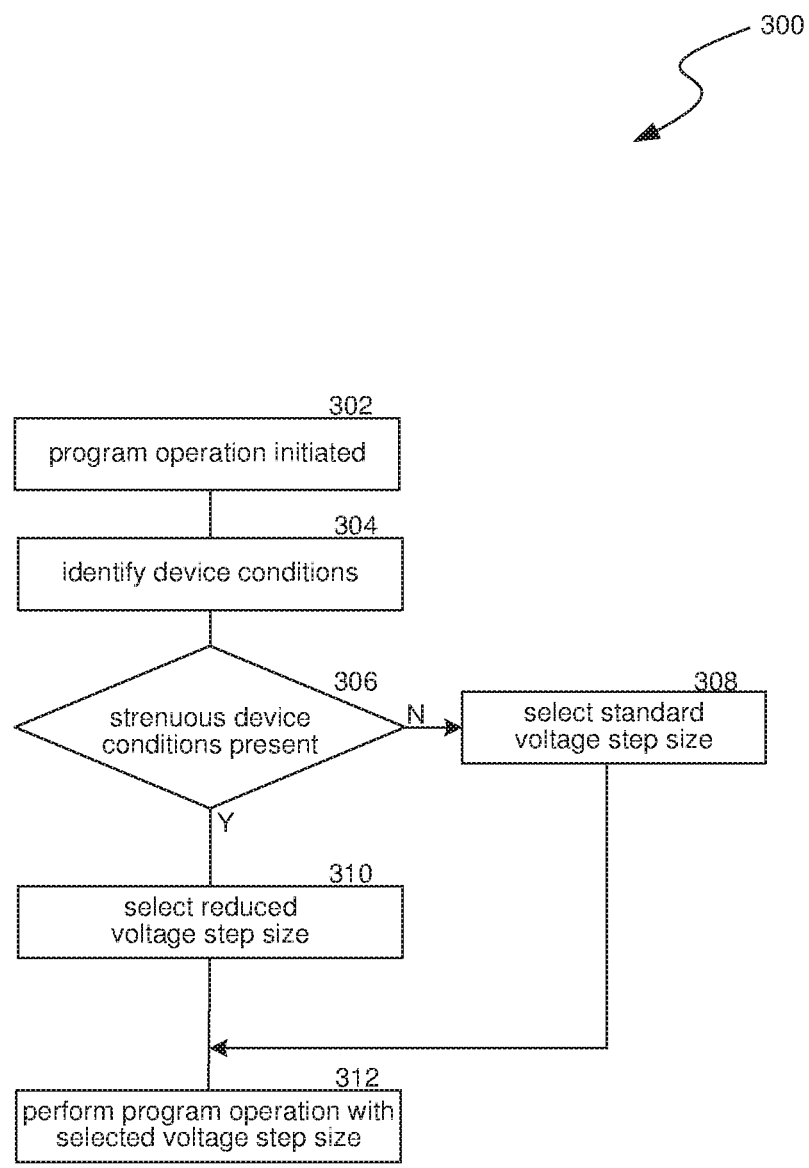
FIG. 3 is a flow diagram for using a dynamically selected a voltage step size in a memory program operation, in accordance with some embodiments of the present disclosure.

FIG. 3 is a flow diagram of an example method 300 for using a dynamically selected voltage step size in a memory program operation, in accordance with some implementations of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 300 is performed by the controller 106 of FIG. 1. In other implementations, the method 300 is performed by the host 108 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various implementations. Thus, not all processes are required in every embodiment. Other process flows are possible.

At block 302, a program operation is initiated to record values in target cells of a memory by encoding the values as charge stored in the target memory cells. The charge is stored in the target memory cells by iteratively applying voltage until target levels, mapped to the desired values, are reached. In some implementations, instead of performing all of method 300 for each program operation, blocks 304-310 to select a voltage step size can be performed ahead of time, e.g., when the memory device is initiated, at a set interval, in response to a change in operating conditions (e.g., upon detecting a threshold temperature or number of program/erase cycles), etc.

At block 304, method 300 can determine device conditions for the program operation. Device conditions can comprise various contexts such as temperature, number of program/erase cycles that the target memory cells have previously experienced, a rate of errors for a block containing the target memory cells, etc.

At block 306, method 300 can determine whether the identified device conditions are strenuous device conditions. In some implementations, strenuous device conditions can be a temperature above a high threshold or below a low threshold. Examples of the high threshold are 85 or 105 degrees Celsius, and examples of the low threshold are 0, −10, or −40 degrees Celsius. In some implementations, strenuous device conditions can be a number of program/erase cycles being above a threshold. Examples of program/erase cycle thresholds are 2,000 or 3,000 cycles.

In various implementations, the thresholds can be defined on a device-by-device basis, e.g., by performing a testing procedure calibrated to determine how the cells of the memory device respond to voltage in different temperatures or how they tend to degrade after a number of program/erase cycles. In other implementations, such testing procedures can be applied on a type-of-device basis and devices of that type can be configured with the determined thresholds. Testing per device type allows for devices to be tested at a high number of program/erase cycles to determine how the device type actually performs after a large number of cycles, instead of extrapolating from a few cycles as would be done when determining thresholds on a per-device basis. In some implementations, the thresholds can be defined based on the expected use of the device. For example, different thresholds can be used in memory devices designated for enterprise consumer electronics or for automotive applications. For example, strenuous device conditions for devices designed for enterprise consumer applications can be a temperature outside 0 degrees Celsius to 75 or 85 degrees Celsius, while devices designed for automotive applications can identify strenuous device conditions at temperatures outside a range of −40 or −10 degrees Celsius to 85 or 105 degrees Celsius. The dynamic program voltage step can be used to improve reliabilty (at unchanged operating limits) or to extend the limits of functionality.

If there are strenuous device conditions, method 300 can proceed to block 310. If there are not strenuous device conditions, method 300 can proceed to block 308. At block 310, a reduced voltage step size can be selected. The reduced voltage step size, when in strenuous conditions, causes smaller iterations of voltage to be applied, reducing the likelihood that memory cells will be over-charged. At block 308, a standard voltage step size can be selected. The standard voltage step size, when not in strenuous conditions, allows for fewer iterations of voltage to be applied, reducing the time need to perform the program operation.

In some implementations, instead of a binary determination for strenuous device conditions, multiple ranges e.g., of temperatures, program/erase cycles, etc., can be defined, with each range mapped to a corresponding voltage step size. Once device conditions are identified at block 304, a corresponding voltage step size can be selected from the mappings. This allows more precise control in striking the balance between programming time and error rates. In some cases, trigger conditions can cause the selecting of reduced voltage step sizes. For example, an error rate at which the memory device is over-charging memory cells can be tracked, and when this rate exceeds a threshold it can trigger a reduction in the voltage step size.

At block 312, the program operation can be performed using the selected voltage step size, as described above in relation to FIG. 2.

Figure 4:
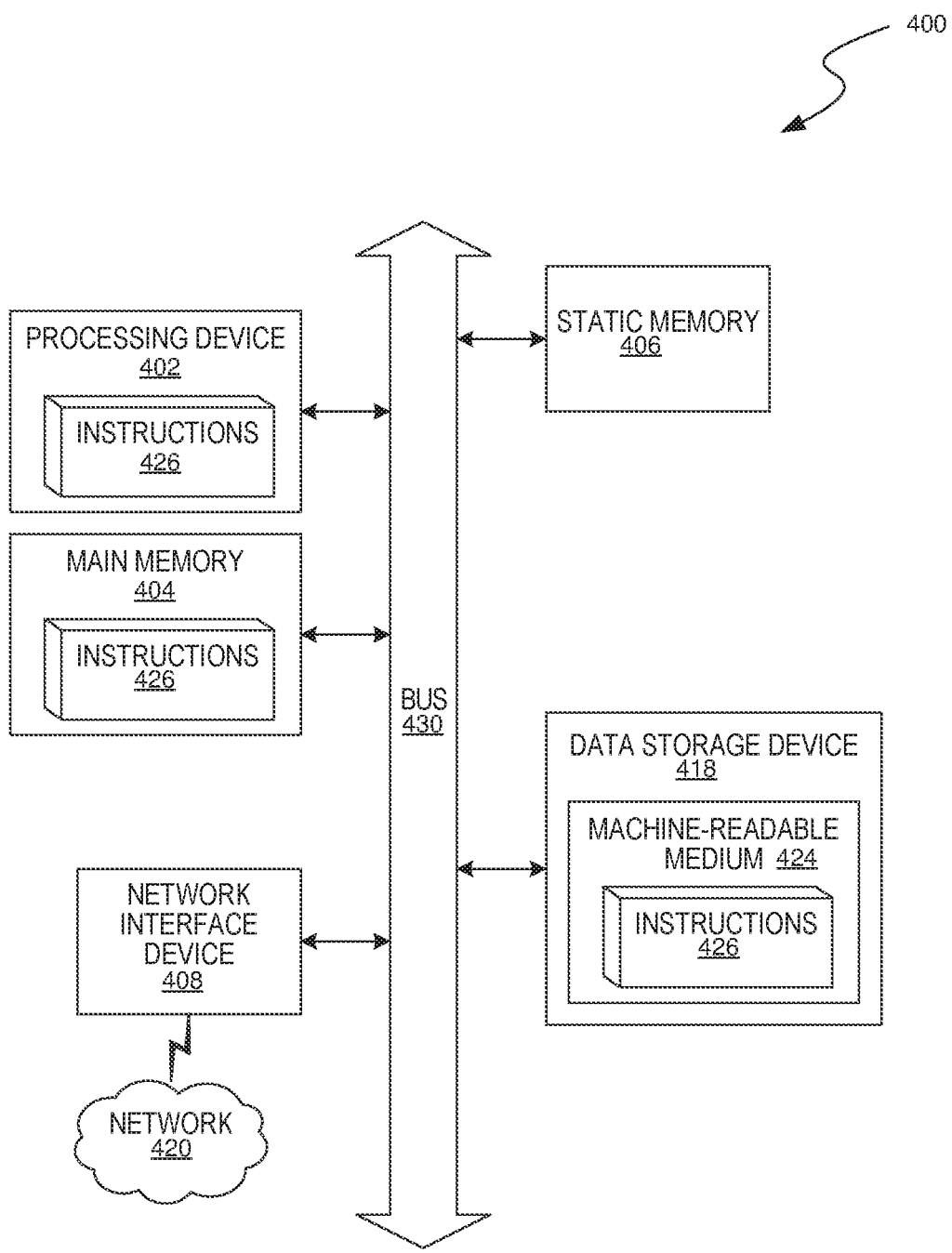
FIG. 4 is a block diagram of an example computer system, in accordance with some embodiments of the present disclosure.

FIG. 4 illustrates an example machine of a computer system 400 within which a set of instructions, for causing the machine to perform any one or more of the methodologies discussed herein, can be executed. In some implementations, the computer system 400 can correspond to a host system (e.g., host 108) that includes, is coupled to, or utilizes a memory sub-system (e.g., memory 102) or can be used to perform the operations of a controller. In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402. The machine-readable storage medium 424, data storage system 418, and/or main memory 404 can correspond to the memory sub-system.

In some implementations, the instructions 426 include instructions to implement functionality for dynamically selecting programming voltage step sizes based on current device conditions. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-4 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

I claim:

1. A method comprising:
   identifying device conditions for a memory device;
   comparing the device conditions to one or more thresholds to determine whether the memory device is experiencing strenuous device conditions;
   when, based on the comparing, the memory device is determined to be experiencing strenuous device conditions, selecting a reduced voltage step size;
   when, based on the comparing, the memory device is determined to not be experiencing strenuous device conditions, selecting a standard voltage step size; and
   performing a program operation on the memory device, wherein performing the program operation comprises iteratively applying a voltage amount, that is based on the selected voltage step size, until a target charge is achieved.

2. The method of claim 1,
   wherein the device conditions specify a temperature; and
   wherein at least a first one of the one or more thresholds specifies a maximum temperature before the memory device is considered to be experiencing strenuous device conditions and at least a second one of the one or more thresholds specifies a minimum temperature before the memory device is considered to be experiencing strenuous device conditions.

3. The method of claim 1,
   wherein the device conditions specify a number of program/erase cycles; and
   wherein at least one of the one or more thresholds specifies a threshold number of program/erase cycles before the memory device is considered to be experiencing strenuous device conditions.

4. The method of claim 1,
   wherein the device conditions specify an error rate; and
   wherein at least one of the one or more thresholds specifies a threshold error rate before the memory device is considered to be experiencing strenuous device conditions.

5. The method of claim 1, wherein the method is performed by a controller of the memory device.

6. The method of claim 1, wherein the memory device is a Negative AND (NAND) memory device.

7. The method of claim 1, wherein at least one of the one or more thresholds was defined based on a testing procedure performed on a test memory device, other than the memory device, that has a same type as a type of the memory device.

8. The method of claim 1, wherein at least one of the one or more thresholds was defined based on a testing procedure, performed on the memory device, calibrated to determine how the memory device reacts to extreme heat or cold.

9. The method of claim 1, wherein at least one of the one or more thresholds was defined based on a testing procedure calibrated to determine how the memory device reacts to program/erase cycles.

10. A non-transitory computer-readable storage medium comprising instructions that, when executed by one or more processing devices, cause the one or more processing devices to:
    identify device conditions for a memory device;
    apply a mapping of device conditions to voltage step sizes to select a voltage step size corresponding to the identified device conditions; and
    performing a program operation on the memory device, wherein performing the program operation comprises iteratively applying a voltage amount, that is based on the selected voltage step size, until a target charge is achieved.

11. The computer-readable storage medium of claim 10, wherein the identified device conditions specify a temperature; and
    wherein at least a part of the mapping specifies a temperature range, including the specified temperature, mapped to the selected voltage step size.

12. The computer-readable storage medium of claim 10, wherein the identified device conditions specify a number of program/erase cycles; and
    wherein at least a part of the mapping specifies a threshold number of program/erase cycles mapped to the selected voltage step size.

13. The computer-readable storage medium of claim 10, wherein at least part of the mapping was defined based on a testing procedure, performed on the memory device, calibrated to determine how the memory device reacts to extreme heat or cold.

14. A memory system comprising:
    a memory array;
    multiple programming voltage step registers, each programming voltage step register storing an indication of a voltage or voltage increment amount; and
    a controller configured to select one of the multiple programming voltage step registers based on a determination of conditions of the memory system that correspond to the selected programming voltage step register,
    wherein the controller is further configured to perform a program operation on one or more cells in the memory array based on the selected programming voltage step register, wherein performing the program operation comprises iteratively applying a voltage amount that is based on a value stored in the selected programming voltage step register, until a target charge is achieved.

15. The memory system of claim 14,
    wherein the conditions of the memory system specify a temperature; and
    wherein the selection of one of the multiple programming voltage step registers is based on a determination that the specified temperature corresponds to the selected programming voltage step register.

16. The memory system of claim 14,
    wherein the conditions of the memory system specify a number of program/erase cycles; and
    wherein the selection of one of the multiple programming voltage step registers is based on a determination that the specified number of program/erase cycles corresponds to the selected programming voltage step register.

17. The memory system of claim 14,
    wherein the conditions of the memory system specify an error rate; and
    wherein the selection of one of the multiple programming voltage step registers is based on a determination that the specified error rate corresponds to the selected programming voltage step register.

18. The memory system of claim 14, wherein the correspondence between the conditions of the memory system and the selected programming voltage step register was defined based on a testing procedure performed on a test memory device, other that the memory system, that has a same type as a type of the memory system.

19. The memory system of claim 14, wherein the correspondence between the conditions of the memory system and the selected programming voltage step register was defined based on a testing procedure, performed on the memory system, calibrated to determine how the memory system reacts to extreme heat or cold.

20. The memory system of claim 14, wherein the correspondence between the conditions of the memory system and the selected programming voltage step register was defined based on a testing procedure calibrated to determine how the memory system reacts to program/erase cycles.

* * * * *